(12) United States Patent
Abe et al.

(10) Patent No.: US 11,709,402 B2
(45) Date of Patent: Jul. 25, 2023

(54) DISPLAY DEVICE COMPRISING A SENSOR LOCATED BETWEEN A BASE AND A LIQUID CRYSTAL LAYER AND THAT OUTPUTS A DETECTION SIGNAL CORRESPONDING TO INCIDENT LIGHT

(71) Applicant: Japan Display Inc., Tokyo (JP)

(72) Inventors: Hiroyuki Abe, Tokyo (JP); Akihiko Saitoh, Tokyo (JP); Masateru Morimoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/883,659

(22) Filed: Aug. 9, 2022

(65) Prior Publication Data
US 2023/0051710 A1    Feb. 16, 2023

(30) Foreign Application Priority Data

Aug. 10, 2021 (JP) ................. 2021-130851

(51) Int. Cl.
| | |
|---|---|
| *G02F 1/1362* | (2006.01) |
| *H01L 27/146* | (2006.01) |
| *G06V 40/13* | (2022.01) |
| *H10K 39/32* | (2023.01) |
| *G02F 1/1343* | (2006.01) |
| *G02F 1/1368* | (2006.01) |

(52) U.S. Cl.
CPC .... *G02F 1/136209* (2013.01); *G06V 40/1318* (2022.01); *H01L 27/14605* (2013.01); *H01L 27/14623* (2013.01); *H10K 39/32* (2023.02); *G02F 1/13685* (2021.01); *G02F 1/134363* (2013.01)

(58) Field of Classification Search
CPC ................ G02F 1/13685; G06F 2203/0338
See application file for complete search history.

(56) References Cited

U.S. PATENT DOCUMENTS

| | | | | |
|---|---|---|---|---|
| 2010/0321355 | A1* | 12/2010 | Gotoh | G02F 1/13338 345/207 |
| 2012/0013595 | A1* | 1/2012 | Murai | G06F 3/0412 345/87 |
| 2012/0139866 | A1* | 6/2012 | Jung | H01L 27/1446 257/E31.127 |
| 2012/0200546 | A1* | 8/2012 | Miyamoto | G02F 1/13338 257/66 |
| 2019/0102039 | A1* | 4/2019 | Uehara | G06F 3/0445 |
| 2020/0265207 | A1 | 8/2020 | Chu et al. | |

* cited by examiner

*Primary Examiner* — Paul C Lee
(74) *Attorney, Agent, or Firm* — Michael Best & Friedlich LLP

(57) ABSTRACT

According to one embodiment, a display device includes a first substrate, a second substrate, a liquid crystal layer and an illumination device. The first substrate includes a base, a sensor, a sensor circuit and a sensor light-shielding layer. The sensor is located between the base and the liquid crystal layer in a display area that includes pixels, and outputs a detection signal corresponding to light becoming incident from a side of the liquid crystal layer. The sensor circuit includes a switching element and is connected to the sensor. The sensor light-shielding layer is opposed to a channel area formed in a semiconductor layer included in the switching element, and blocks light from the illumination device on the channel area.

9 Claims, 9 Drawing Sheets

DISPLAY DEVICE COMPRISING A SENSOR LOCATED BETWEEN A BASE AND A LIQUID CRYSTAL LAYER AND THAT OUTPUTS A DETECTION SIGNAL CORRESPONDING TO INCIDENT LIGHT

CROSS-REFERENCE TO RELATED APPLICATIONS

This application is based upon and claims the benefit of priority from Japanese Patent Application No. 2021-130851, filed Aug. 10, 2021, the entire contents of which are incorporated herein by reference.

FIELD

Embodiments described herein relate generally to a display device.

BACKGROUND

In recent years, a display device with a built-in sensor that detects biological information, such as a fingerprint sensor or a vein sensor, has come to be developed. For this type of sensor, for example, an optical sensor that uses a photoelectric conversion element is employed.

Such an optical sensor detects light emitted from a light source, such as a backlight, for example, and reflected on a target object. When light other than the light reflected by the target object becomes incident on the optical sensor, noise may be introduced, and degrade the detection accuracy.

DETAILED DESCRIPTION

In general, according to one embodiment, a display device comprises a first substrate, a second substrate, a liquid crystal layer and an illumination device. The second substrate is opposed to the first substrate. The liquid crystal layer is located between the first substrate and the second substrate. The illumination device is opposed to the first substrate and disposed on an opposite side of the second substrate. The first substrate includes a base, a sensor, a sensor circuit and a sensor light-shielding layer. The sensor is located between the base and the liquid crystal layer in a display area that includes pixels, and outputs a detection signal corresponding to light becoming incident from a side of the liquid crystal layer. The sensor circuit includes a switching element and is connected to the sensor. The sensor light-shielding layer is opposed to a channel area formed in a semiconductor layer included in the switching element, and blocks light from the illumination device on the channel area.

Figure 1:
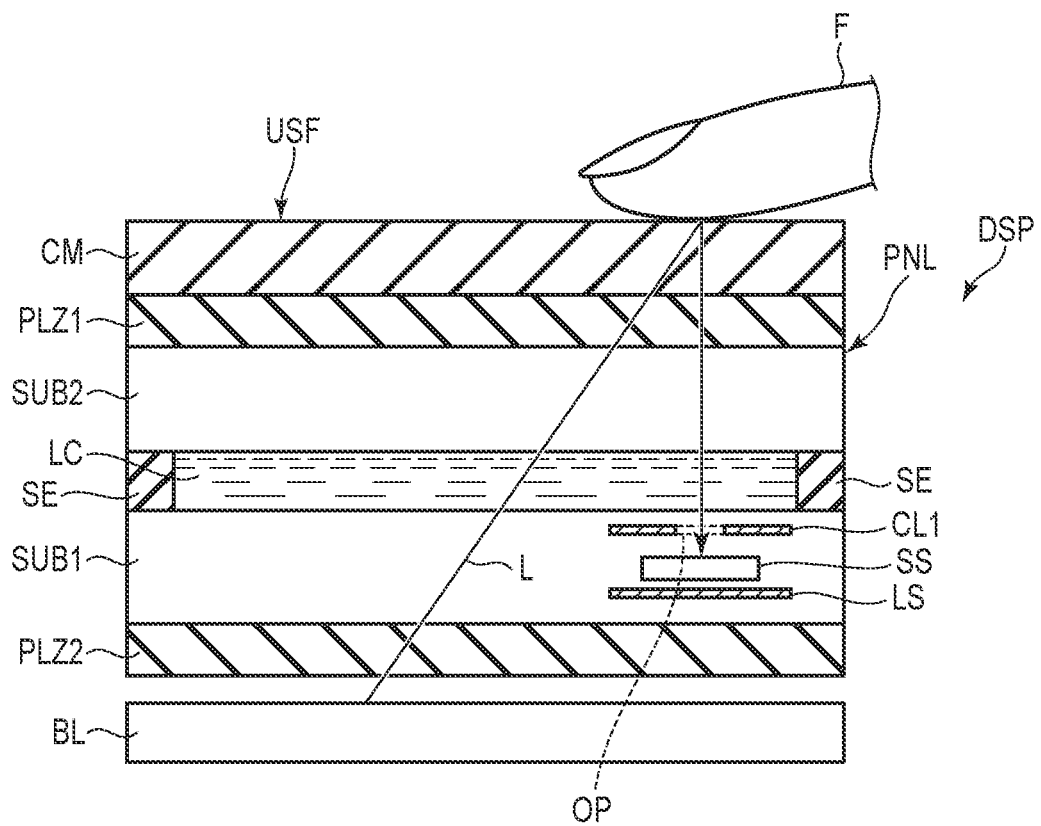
FIG. 1 schematically shows a display device according to an embodiment.

FIG. 1 is a diagram schematically showing a display device DSP according to an embodiment. The display device DSP includes a display panel PNL, a cover member CM, a first polarizer PLZ1, a second polarizer PLZ2, and an illumination device BL.

The display panel PNL is a liquid crystal display panel, and includes a first substrate SUB1, a second substrate SUB2 opposed to the first substrate SUB1, a sealing member SE, and a liquid crystal layer LC. The sealing member SE seals the liquid crystal layer LC between the first substrate SUB1 and the second substrate SUB2. The display panel PNL according to the present embodiment is a transmissive display that displays an image by selectively transmitting the light from the rear side of the first substrate SUB1 to the upper surface of the second substrate SUB2.

The first substrate SUB1 includes a sensor SS, a collimating layer CL1, and a light-shielding layer LS. The sensor SS is located between the collimating layer CL1 and the light-shielding layer LS. The collimating layer CL1 has an opening OP overlapping with the sensor SS. Although details will be described later, in the present embodiment, the collimating layer CL1 is formed of a metal material and is light-blocking. For this reason, the collimating layer CL1 may be referred to as a metal layer or a light-shielding layer. Though not shown in FIG. 1, such a collimating layer may also be disposed in the second substrate SUB2.

The sealing member SE bonds the first substrate SUB1 and the second substrate SUB2. A spacer (not shown) forms a predetermined cell gap between the first substrate SUB1 and the second substrate SUB2. The cell gap is filled with the liquid crystal layer LC.

The cover member CM is provided on the display panel PNL. For example, a glass substrate or a resin substrate may be used as the cover member CM. The cover member CM has an upper surface USF with which a target object to be detected by the sensor SS is brought into contact. In the present embodiment, it is assumed that the upper surface USF of the cover member CM extends in parallel with the upper surface of the sensor SS. In the example of FIG. 1, a finger F that is an example of the target object is in contact with the upper surface USF. The first polarizer PLZ1 is provided between the display panel PNL and the cover member CM.

The illumination device BL is provided under the display panel PNL and irradiates the first substrate SUB1 with light L. The illumination device BL is, for example, a side-edge type backlight, and includes a plate-shaped light guide and a plurality of light sources that emit light toward a side surface of the light guide. The second polarizer PLZ2 is provided between the display panel PNL and the illumination device BL.

Of the light L, the reflected light reflected on the finger F becomes incident on the sensor SS via the opening OP formed in the collimating layer CL1. In other words, the reflected light reflected on the finger F transmits through the cover member CM, the first polarizer PLZ1, the second substrate SUB2, the liquid crystal layer LC, and a part of the first substrate SUB1 located above the sensor SS before becoming incident on the sensor SS.

The sensor SS outputs a detection signal corresponding to the incident light. As will be described later, the display panel PNL includes a plurality of sensors SS, and can detect the uneven parts (a fingerprint, for example) of the finger F based on the detection signals output from these sensors SS.

In order to obtain a more accurate detection signal, the sensors SS preferably detects incident light that is parallel with the normal direction of the upper surface USF. The collimating layer CL1 functions as a collimator that collimates the incident light on the sensor SS. In other words, the collimating layer CL1 blocks the light angled with respect to the normal direction of the upper surface USF (that is, light angled with respect to the normal direction of the upper surface of the sensor SS).

As described above, by installing the sensors SS in the display device DSP, a function as a fingerprint sensor can be added to the display device DSP. In addition, it is possible to use the sensor SS to detect information related to a living body based on the light reflected internal of the finger F, in addition to or alternatively to detecting a fingerprint. The information related to a living body is, for example, a blood vessel image of a vein or the like, a pulse, a pulse wave.

Figure 2:
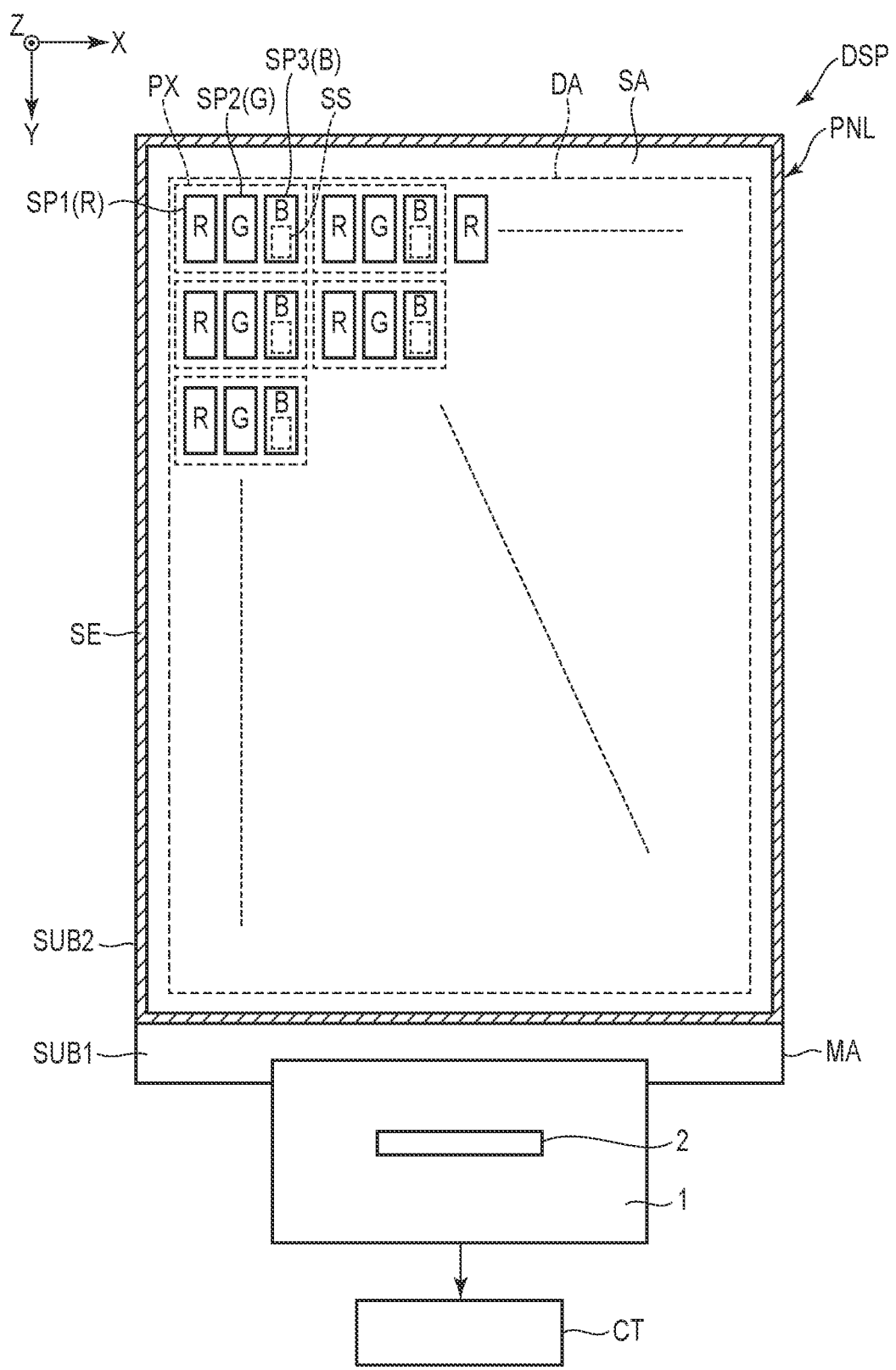
FIG. 2 is a plan view schematically showing the display device according to the embodiment.

FIG. 2 is a plan view schematically showing a display device DSP according to the present embodiment. The display device DSP includes the display panel PNL, which has been described above, and a wiring substrate 1 mounted on the display panel PNL. The display panel PNL includes a display area DA for displaying an image and a peripheral area SA surrounding the display area DA. The peripheral area SA may also be referred to as a non-display area.

The first substrate SUB1 has a mounting area MA not overlapping with the second substrate SUB2. The sealing member SE is located in the peripheral area SA. In FIG. 2, an area where the sealing member SE is disposed is indicated as hatched. The display area DA is located inside the sealing member SE. The display panel PNL includes a plurality of pixels PX arrayed in a matrix in a first direction X and a second direction Y in the display area DA.

Each of the pixel PX includes a sub-pixel SP1 that emits red (R) light, a sub-pixel SP2 that emits green (G) light, and a sub-pixel SP3 that emits blue (B) light. Incidentally, note that the pixel PX may include a sub-pixel that emits light other than red, green, and blue.

In the example shown in FIG. 2, one sensor SS is disposed correspondingly to each of the pixels PX. More specifically, one sensor SS is disposed correspondingly to the sub-pixel SP3 emitting blue light, among the sub-pixels included in each of the pixels PX. Across the entire display area DA, the plurality of sensors SS are arranged in a matrix in the first direction X and the second direction Y.

The sensor SS is not necessarily disposed for every one of the pixels PX. For example, the sensors SS may be disposed at a ratio of one to a plurality of pixels PX. In addition, the sensor SS may be disposed for the pixels PX in some areas of the display area DA, and not disposed for the pixels PX in other areas.

The wiring substrate 1 is, for example, a flexible printed circuit, and is connected to a terminal provided in a mounting area MA. In addition, the wiring substrate 1 includes a driver 2 that drives the display panel PNL. Incidentally, the driver 2 may be implemented at another position such as the mounting area MA. For example, the driver 2 includes an integrated circuit that controls displaying operations of the pixels PX, and an integrated circuit that controls a detection operation performed by the sensor SS. These integrated circuits may be implemented at different positions. The detection signals output from the sensors SS are output to the controller CT via the wiring substrate 1 and the driver 2. The controller CT executes arithmetic processing and the like for detecting a fingerprint based on the detection signals from the plurality of sensors SS.

Figure 3:
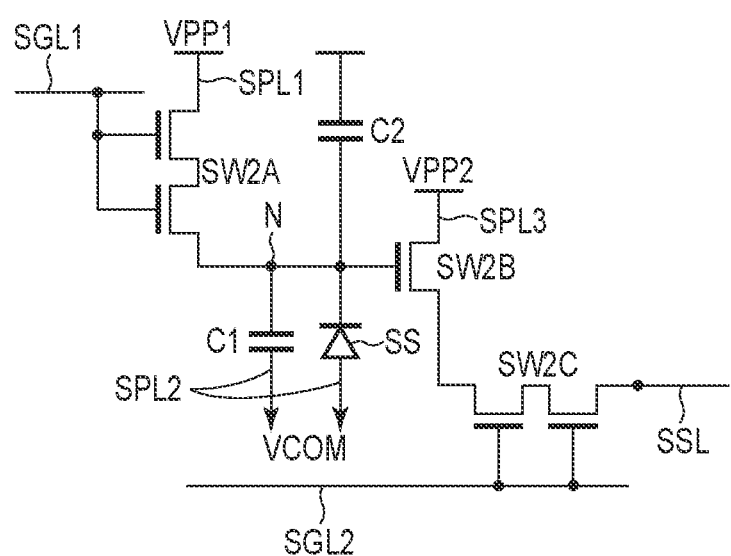
FIG. 3 is an equivalent circuit diagram showing a sensor according to the embodiment and a sensor circuit for the sensor.

FIG. 3 is an equivalent circuit diagram showing the sensor SS according to the embodiment and a sensor circuit for the sensor SS.

As shown in FIG. 3, the sensor circuit is provided with a first sensor scanning line SGL1, a second sensor scanning line SGL2, a first sensor power line SPL1, a second sensor power line SPL2, a third sensor power line SPL3, a sensor signal line SSL, a switching element SW2A, a switching element SW2B, a switching element SW2C, a capacitor C1, and a capacitor C2.

Incidentally, in the following description, the first sensor scanning line SGL1 will be referred to as a first scanning line SGL1, the second sensor scanning line SGL2 will be referred to as a second scanning line SGL2. The first sensor power line SPL1 will be referred to as a first power line SPL1, the second sensor power line SPL2 will be referred to as a second power line SPL2, and the third sensor power line SPL3 will be referred to as a third power line SPL3.

In addition, FIG. 3 shows an example in which each of the switching elements SW2A, SW2B, and SW2C is provided as an n-type thin-film transistor (TFT), but each of the switching elements SW2A, SW2B, and SW2C may also be provided as a p-type TFT.

One electrode of the sensor SS is connected to the second power line SPL2, and the other electrode is connected to a node N. The node N is connected to the drain electrode of the switching element SW2A and the gate electrode of the switching element SW2B. A second voltage VCOM is supplied to the one electrode of the sensor SS through the second power line SPL2. The second voltage VCOM may be referred to as a reference voltage. When light becomes incident on the sensor SS, a current corresponding to the amount of incident light flows through the sensor SS. As a result, the capacitance retained by the capacitor C1 changes. Incidentally, the capacitance retained in the capacitor C2 is a parasitic capacitance added to the capacitance retained by the capacitor C1.

The switching element SW2A has a gate electrode connected to the first scanning line SGL1, a source electrode connected to the first power line SPL1, and a drain electrode connected to the node N. When the switching element SW2A is switched on in response to the scanning signal supplied from the first scanning line SGL1, the electric potential of the node N is reset to the potential of a first voltage VPP1 supplied through the first power line SPL1. The second voltage VCOM exhibits a voltage lower than the first voltage VPP1, and the sensor SS is driven by a reverse bias.

The switching element SW2B has a gate electrode connected to the node N, a source electrode connected to the third power line SPL3, and a drain electrode connected to the source electrode of the switching element SW2C. When the switching element SW2B is switched on, a current corresponding to the capacitance retained by the capacitor C1 is amplified and flows into the switching element SW2C.

The switching element SW2C has a gate electrode connected to the second scanning line SGL2, a source electrode connected to the drain electrode of the switching element SW2B, and a drain electrode connected to the sensor signal line SSL. When the switching element SW2C is switched on in response to the scanning signal supplied from the second scanning line SGL2, an electric signal (detection signal) corresponding to the current from the switching element SW2B is output to the sensor signal line SSL.

Although FIG. 3 shows the an example in which the switching elements SW2A and SW2C have the double-gate structure, the switching elements SW2A and SW2C may have a single-gate structure or a multi-gate structure.

A structure that may be applied to the first substrate SUB1 will now be explained in more detail with reference to FIGS. 4 to 7. Incidentally, note that FIGS. 4 to 7 schematically show the configuration of the first substrate SUB1 in a cross-sectional view and a plan view, respectively, and positional relationships and the shapes of the elements in one are not necessarily matched with those in the other.

Figure 4:
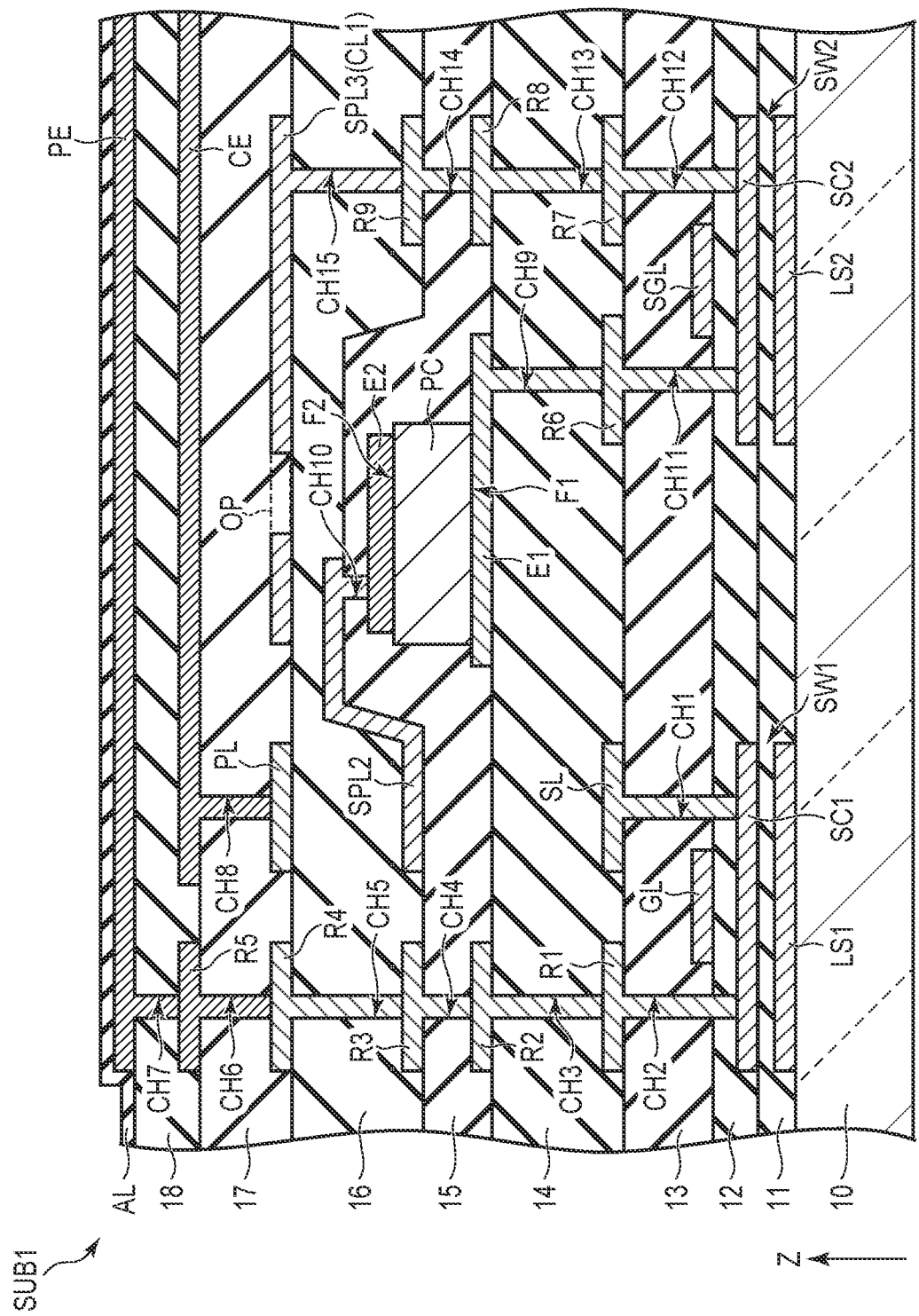
FIG. 4 is a schematic cross-sectional view showing an example of a structure that may be applied to a first substrate according to the embodiment.

FIG. 4 is a schematic cross-sectional view showing an example of a structure that may be applied to the first substrate SUB1. The first substrate SUB1 includes a transparent first base 10, insulating layers 11, 12, 13, 14, 15, 16, 17, and 18, and an alignment film AL.

The first base 10 is, for example, a glass substrate or a resin substrate. The insulating layers 11, 12, 13, 15, and 18 are formed of an inorganic material. The insulating layers 14, 16, and 17 are formed of an organic material. The insulating layers 11, 12, 13, 14, 15, 16, 17, and 18 and the alignment film AL are laminated on the first base 10, in the order listed herein, in the third direction Z.

The first substrate SUB1 includes, as elements related to displaying images, a signal line SL, a scanning line GL, a first light-shielding layer LS1 (pixel light-shielding layer), a switching element SW1, a pixel electrode PE, a common electrode CE, relay electrodes R1, R2, R3, R4, and R5, and a power line PL. The pixel electrode PE and the switching element SW1 are provided correspondingly to each of the sub-pixels SP1, SP2, and SP3. The common electrode CE is provided across the plurality of sub-pixels SP1, SP2, and SP3, for example.

The first light-shielding layer LS1 is interposed between the first base 10 and the insulating layer 11. The switching element SW1 includes a semiconductor layer SC1. The semiconductor layer SC1 is interposed between the flexible printed circuit the insulating layers 11 and 12, and is opposed to the first light-shielding layer LS1. The scanning line GL is interposed between insulating layers 12 and 13, and is opposed to the semiconductor layer SC1. Incidentally, note that scanning line GL may be disposed not between insulating layers 12 and 13 but between other layers. The signal line SL is interposed between the insulating layers 13 and 14, and is in contact with the semiconductor layer SC1 via a contact hole CH1 penetrating the insulating layers 12 and 13.

The first light-shielding layer LS1 is disposed in a manner overlapping with an area where semiconductor layer SC1 and scanning line GL oppose to each other in planar view. With this, it becomes possible to suppress the entry of the light into the channel area of the semiconductor layer SC1 formed at a position opposed to the scanning line GL, from the side of the first base 10, and to suppress optical leakage.

The relay electrode R1 is interposed between the insulating layers 13 and 14, that is, disposed in the same layer as the signal line SL, and is in contact with the semiconductor layer SC1 via the contact hole CH2 penetrating the insulating layers 12 and 13. The relay electrode R2 is interposed between the insulating layers 14 and 15, and is in contact with the relay electrode R1 via a contact hole CH3 penetrating the insulating layer 14. The relay electrode R3 is interposed between the insulating layers 15 and 16, and is in contact with the relay electrode R2 via a contact hole CH4 penetrating the insulating layer 15. The relay electrode R4 is interposed between the insulating layers 16 and 17, and is in contact with the relay electrode R3 via a contact hole CH5 penetrating the insulating layer 16. The relay electrode R5 is interposed between the insulating layers 17 and 18, and is in contact with the relay electrode R4 via a contact hole CH6 penetrating the insulating layer 17.

The pixel electrode PE is interposed between the insulating layer 18 and the alignment film AL, and is in contact with the relay electrode R5 via a contact hole CH7 penetrating the insulating layer 18. In other words, the power line PL is interposed between the insulating layers 16 and 17, that is, disposed in the same layer as the relay electrode R4. In other words, the common electrode CE is interposed between the insulating layers 17 and 18, that is, disposed in the same layer as the relay electrode R5, and is in contact with the power line PL via a contact hole CH8 penetrating the insulating layer 17.

A common voltage is supplied to the power line PL. This common voltage is supplied to the common electrode CE. A video signal is supplied to the signal line SL, and a scanning signal is supplied to the scanning line GL. When the scanning signal is supplied to the scanning line GL, the video signal of the signal line SL is supplied to the pixel electrode PE via the semiconductor layer SC1 and the relay electrodes R1, R2, R3, R4, and R5. At this time, an electric field formed by a potential difference between the common voltage and a video signal is generated between the pixel electrode PE and the common electrode CE, and this electric field acts on the liquid crystal layer LC.

The first substrate SUB1 includes a second light-shielding layer LS2 (sensor light-shielding layer), a switching element SW2, a sensor scanning line SGL, relay electrodes R6, R7, R8, and R9, a second power line SPL2, and a third power line SPL3, as elements related to the sensor SS. In addition, the sensor SS includes a first electrode E1 (lower electrode), a second electrode E2 (upper electrode), and a photoelectric conversion element PC.

Incidentally, in FIG. 4, for the convenience of descriptions, elements associated with the plurality of switching elements SW2A, SW2B, and SW2C that are related to the sensor SS are represented as a switching element SW2. In addition, in FIG. 4, an element functioning as the gate electrode of the switching element SW2 is represented as a sensor scanning line SGL. In FIG. 4, an element functioning as the source electrode of the switching element SW2 is represented as the relay electrode R7. In FIG. 4, an element functioning as a drain electrode of the switching element SW2 is represented as the relay electrode R6. In addition, in FIG. 4, not all but some of the elements related to the sensor SS are shown. For example, it is possible to consider that the relay electrode R6 shown in FIG. 4 is connected to the drain of the switching element SW2A, and the relay electrode R7 is connected to the source of the switching element SW2B.

The photoelectric conversion element PC has a first surface F1 opposed to the first base 10 and a second surface F2 opposed to the liquid crystal layer LC. The second surface F2 of the photoelectric conversion element PC corresponds to the upper surface of the sensor SS. The photoelectric conversion element PC is located between the insulating layers 14 and 15. The first electrode E1 is interposed between the photoelectric conversion element PC and the insulating layer 14, and is in contact with the first surface F1. The outer peripheral portion of the first electrode E1 project out from the photoelectric conversion element PC, and is covered by the insulating layer 15. The first electrode E1 is in contact with the relay electrode R6, below the photoelectric conversion element PC, via a contact hole CH9 penetrating the insulating layer 14. The second electrode E2 is interposed between the photoelectric conversion element PC and the insulating layer 15, and is in contact with the second surface F2. The second electrode E2 is in contact with the second power line SPL2 via a contact hole CH10 penetrating the insulating layer 15 above the photoelectric conversion element PC.

The second power line SPL2 is interposed between the insulating layers 15 and 16, and is in contact with the second electrode E2 via the contact hole CH10 penetrating the insulating layer 15. The second voltage VCOM is supplied to the second power line SPL2, and the second voltage VCOM is supplied to the second electrode E2 via the second power line SPL2.

The second light-shielding layer LS2 is interposed between the first base 10 and the insulating layer 11. The switching element SW2 includes a semiconductor layer SC2. The semiconductor layer SC2 is interposed between the insulating layers 11 and 12, and is opposed to the second light-shielding layer LS2. The sensor scanning line SGL is interposed between the insulating layers 12 and 13, and is opposed to the semiconductor layer SC2. Incidentally, note that the sensor scanning line SGL may be disposed not between the insulating layers 12 and 13 but between other layers.

Although details will be explained later together with the description of FIG. 5, the second light-shielding layer LS2 is disposed at least in an area where the semiconductor layer SC2 and the sensor scanning line SGL opposed to each other. With this, it becomes possible to suppress the entry of the light into the channel area of the semiconductor layer SC2 formed at a position opposed to the sensor scanning line SGL, from the side of the first base 10, and to suppress optical leakage.

The relay electrode R6 is interposed between the insulating layers 13 and 14, and is in contact with the semiconductor layer SC2 via a contact hole CH11 penetrating the insulating layers 12 and 13. Relay electrode R7 is interposed between insulating layers 13 and 14, that is, between the same layers as relay electrode R6, and is in contact with semiconductor layer SC2 via a contact hole CH12 penetrating the insulating layers 12 and 13. The relay electrode R8 is interposed between the insulating layers 14 and 15, that is, between the same layers as the first electrode E1, and is in contact with the relay electrode R7 via a contact hole CH13 penetrating the insulating layer 14.

The relay electrode R9 is interposed between the insulating layers 15 and 16, that is, between the same layers as the second power line SPL2, and is in contact with the relay electrode R8 via a contact hole CH14 penetrating the insulating layer 15.

The third power line SPL3 is interposed between the insulating layers 16 and 17, that is, between the same layers as the power line PL, and is in contact with the relay electrode R9 via a contact hole CH15 penetrating the insulating layer 16. A third voltage VPP2 is supplied to the third power line SPL3. In addition to functioning to supply the third voltage VPP2, the third power line SPL3 also functions as the collimating layer CL1 described above. In other words, a part of the third power line SPL3 provides the collimating layer CL1 described above, and the third power line SPL3 has the opening OP at a position overlapping with the second surface F2 of the photoelectric conversion element PC.

The signal line SL and the relay electrodes R1, R6, and R7 are formed of the same metal material. The first electrode E1 and the relay electrodes R2 and R8 are formed of the same metal material. The second power line SPL2 and the relay electrodes R3 and R9 are formed of the same metal material. The power line PL, the third power line SPL3, and the relay electrode R4 are formed of the same metal material. The second electrode E2, the pixel electrode PE, the common electrode CE, and the relay electrode R5 are formed of a transparent conductive material, such as indium tin oxide (ITO).

The first electrode E1 formed of a metal material also functions as a light-shielding layer, and suppresses the entry of light from to the photoelectric conversion element PC, from the underneath. The photoelectric conversion element PC is, for example, a photodiode, and outputs an electric signal (detection signal) corresponding to light incident thereon. More specifically, an organic photodiode (OPD), a positive intrinsic negative (PIN) photodiode, or the like may be used as the photoelectric conversion element PC. For example, the PIN photodiode includes a p-type semiconductor layer, an i-type semiconductor layer, and an n-type semiconductor layer. The p-type semiconductor layer is located on the side of the second electrode E2. The n-type semiconductor layer is located on the side of the first electrode E1, and the i-type semiconductor layer is located between the p-type semiconductor layer and the n-type semiconductor layer.

The p-type semiconductor layer, the i-type semiconductor layer, and the n-type semiconductor layer are formed of, for example, amorphous silicon (a-Si). Incidentally, note that the material of the semiconductor layer is not limited thereto, and amorphous silicon may be replaced with polycrystalline silicon, microcrystalline silicon, or the like, and polycrystalline silicon may be substituted with amorphous silicon or microcrystalline silicon, for example.

A scanning signal is supplied to the sensor scanning line SGL at the timing at which the sensor SS is to perform a detection. When a scanning signal is supplied to the sensor scanning line SGL, a detection signal generated by the photoelectric conversion element PC is output to the sensor signal line SSL (not shown in FIG. 4). The detection signal output to the sensor signal line SSL is output to the controller CT via the driver 2, for example.

Figure 5:
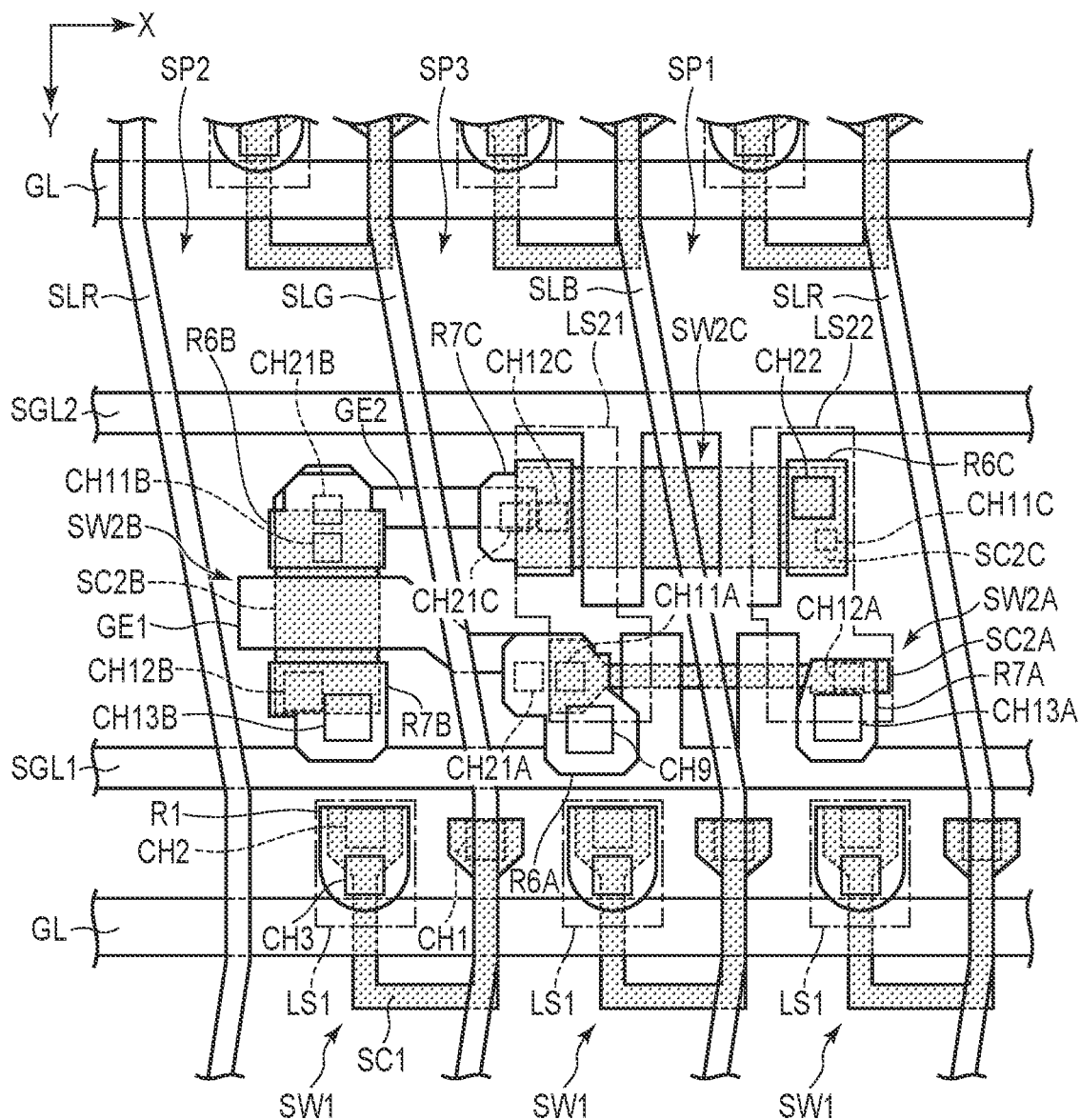
FIG. 5 is a schematic plan view showing an example of a structure that may be applied to the first substrate according to the embodiment.

FIG. 5 is a plan view schematically showing elements that may be applied to the first substrate SUB1 and that are disposed between insulating layers 11, 12, 13, and 14 shown in FIG. 4. In FIG. 5, the contact holes for making contacts with the elements in the layers below the signal line SL and the relay electrodes R1, R6, and R7 are indicated by broken lines, and contact holes for making contact with the elements above the signal line SL and the relay electrodes R1, R6, and R7 are indicated by solid lines.

Figure 6:
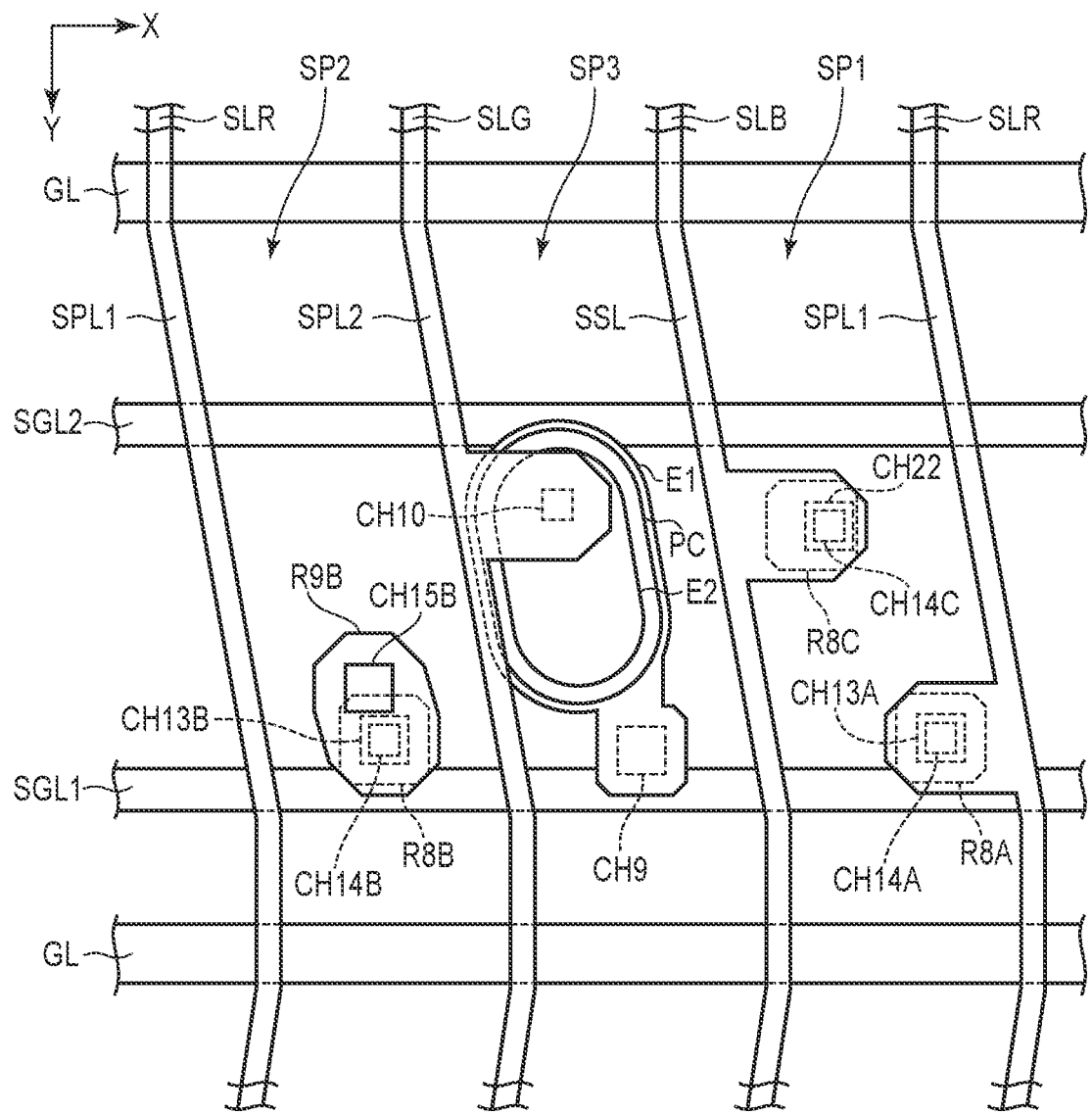
FIG. 6 is a schematic plan view showing an example of a structure that may be applied to the first substrate according to the embodiment.
Figure 7:
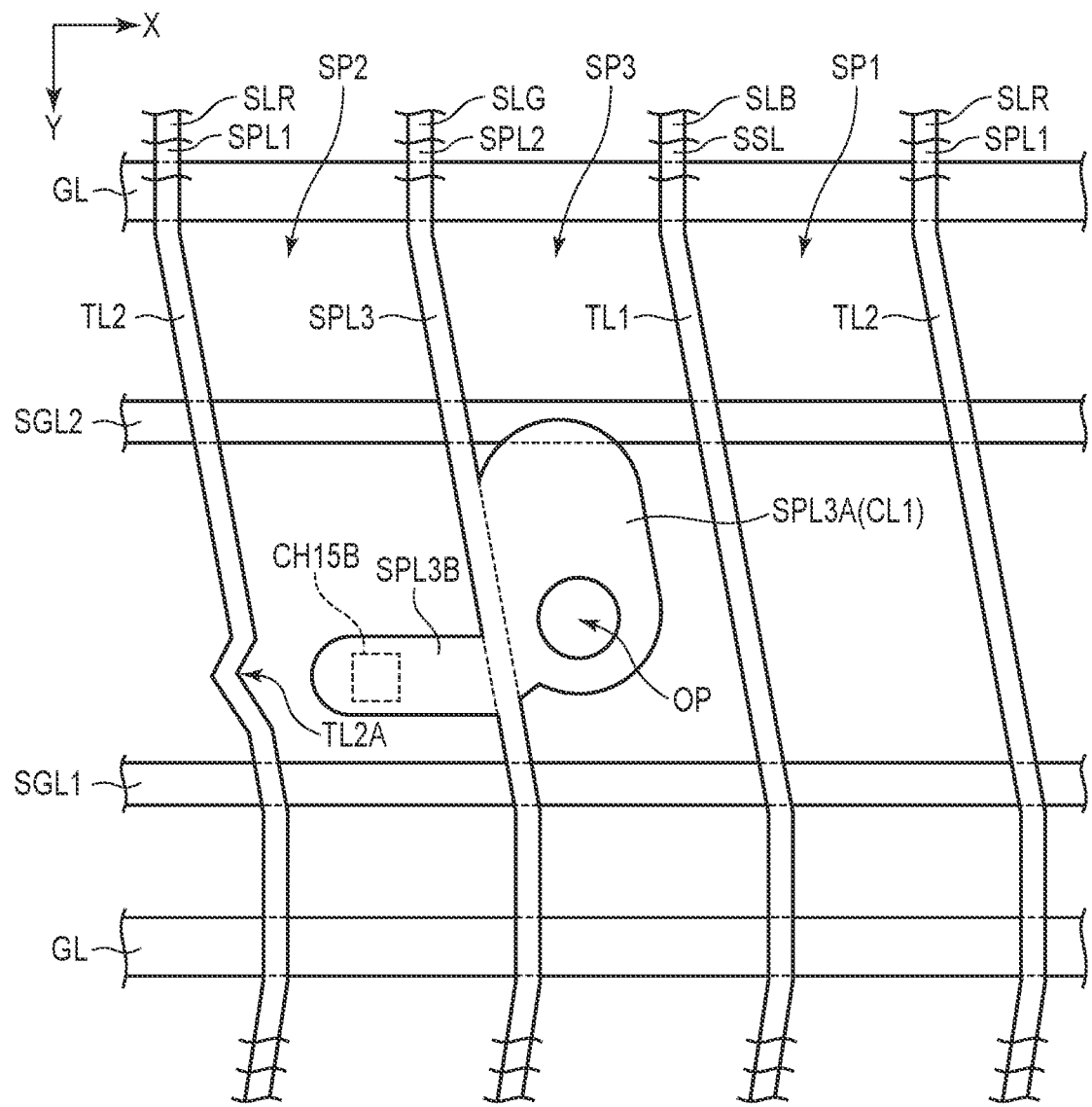
FIG. 7 is a schematic plan view showing an example of a structure that may be applied to the first substrate according to the embodiment.

In addition, in FIGS. 5 to 7, "A" is appended to the ends of the reference numerals of the elements that are related to the switching element SW2A. "B" is appended to the ends of the reference numerals of the elements that are related to the switching element SW2B, and "C" is appended to the ends of the reference numerals of the elements that are related to the switching element SW2C.

The scanning line GL, the first scanning line SGL1, and the second scanning line SGL2 extend along the first direction X and are arranged in the second direction Y. The first scanning line SGL1 and the second scanning line SGL2 are arranged adjacently to each other in the second direction Y. The first scanning line SGL1 and the second scanning line SGL2 are interposed between the two adjacent scanning lines GL.

The signal line SLR corresponding to the red sub-pixel SP1, the signal line SLG corresponding to the green sub-pixel SP2, and the signal line SLB corresponding to the blue sub-pixel SP3 extend in the second direction Y with some bent, and are arranged along the first direction X.

The sub-pixels SP1, SP2, and SP3 are disposed in an area surrounded by two scanning lines GL disposed adjacently to each other in the second direction Y and two signal lines SL disposed adjacently to each other in the first direction X. Each of the sub-pixels SP1, SP2, and SP3 has an opening surrounded by the second scanning line SGL2 and the first scanning line SGL1, and two adjacent signal lines SL.

The first scanning line SGL1 has branch portion (convex portions) extending along the second direction Y. These branch portions function as gate electrodes of the switching element SW2A. The semiconductor layer SC2A is disposed in an area overlapping with the gate electrodes of the switching element SW2A in planar view.

The semiconductor layer SC2A is disposed across the opening of the sub-pixel SP3 and the opening of the sub-pixel SP1, and a part thereof overlaps with the signal line SLB corresponding to the sub-pixel SP3. An island-like shaped relay electrode R7A functioning as a source electrode of the switching element SW2A is disposed at a position overlapping with the semiconductor layer SC2A in the opening of the sub-pixel SP1. The relay electrode R7A is in contact with the semiconductor layer SC2A via the contact hole CH12A. In addition, the relay electrode R7A is in contact with a relay electrode disposed in the layer above the relay electrode R7A, via a contact hole CH13A. The relay electrode R7A does not overlap with a channel area of the semiconductor layer SC2A in planar view, the channel area formed at a position opposed to the branch portion of the first scanning line SGL1.

An island-like shaped relay electrode R6A functioning as a drain electrode of the switching element SW2A is disposed at a position overlapping with the semiconductor layer SC2A in the opening of the sub-pixel SP3. The relay electrode R6A is in contact with semiconductor layer SC2A via a contact hole CH11A. The relay electrode R6A does not overlap with a channel area of the semiconductor layer SC2A in planar view, the channel area formed at a position opposed to the branch portion of the first scanning line SGL1.

The relay electrode R6A is in contact with a first gate electrode GE1 functioning as a gate electrode of switching element SW2B, via a contact hole CH21A. The contact hole CH21 is a through hole penetrating the insulating layer 13, and brings an element positioned in the same layer as the relay electrode R6 into contact with an element positioned in the same layer as the first scanning line SGL1 and the second scanning line SGL2. Incidentally, the relay electrode R6A is in contact with the first electrode E1 disposed above relay electrode R6A, via the contact hole CH9.

The first gate electrode GE1 is disposed across the opening of the sub-pixel SP3 and the opening of the sub-pixel SP2, and a part thereof overlaps with the signal line SLG corresponding to the sub-pixel SP2. In the opening of the sub-pixel SP2, a semiconductor layer SC2B is disposed in an area overlapping with the first gate electrode GE1 in planar view.

An island-like shaped relay electrode R7B functioning as a source electrode of the switching element SW2B is disposed at a position overlapping with the semiconductor layer SC2B. The relay electrode R7B is in contact with semiconductor layer SC2B via a contact hole CH12B. In addition, the relay electrode R7B is in contact with a relay electrode disposed in the layer above the relay electrode R7B, via the contact hole CH13B. The relay electrode R7B does not overlap with a channel area of the semiconductor layer SC2B in planar view, the channel area being formed at a position opposed to the first gate electrode GE1.

An island-like shaped relay electrode R6B functioning as a drain electrode of the switching element SW2B is disposed at a position overlapping with the semiconductor layer SC2B. The relay electrode R6B is in contact with the semiconductor layer SC2B, via a contact hole CH11B. The relay electrode R6B does not overlap with a channel area the semiconductor layer SC2B in planar view, the channel area being formed at a position opposed to first gate electrode GE1.

The relay electrode R6B is in contact with a second gate electrode GE2 via a contact hole CH21B. The second gate electrode GE2 is disposed across the opening of the sub-pixel SP2 and the opening of the sub-pixel SP3, and a part thereof overlaps with the signal line SLG corresponding to the sub-pixel SP2. The switching element SW2B and the switching element SW2C are connected by the second gate electrode GE2.

The second scanning line SGL2 has branch portion (convex portions) extending along the second direction Y. These branch portions function as gate electrodes of the switching element SW2C. A semiconductor layer SC2C is disposed in an area overlapping with the gate electrodes of the switching element SW2C in planar view.

The semiconductor layer SC2C is disposed across the opening of the sub-pixel SP3 and the opening of the sub-pixel SP1, and a part thereof overlaps with the signal line SLB corresponding to the sub-pixel SP3. An island-like shaped relay electrode R7C functioning as a source electrode of the switching element SW2C is disposed in the opening of the sub-pixel SP3, at a position overlapping with the semiconductor layer SC2C. The relay electrode R7C is in contact with the semiconductor layer SC2C via a contact hole CH12C. In addition, the relay electrode R7C is in contact with the second gate electrode GE2 via a contact hole CH21C. The relay electrode R7C does not overlap with a channel area of the semiconductor layer SC2C in planar view, the channel area being formed at a position where the semiconductor layer SC2C is opposed to the branch portions of the second scanning line SGL2.

An island-like shaped relay electrode R6C functioning as a drain electrode of the switching element SW2C is disposed in the opening of the sub-pixel SP1, at a position overlapping with the semiconductor layer SC2C. The relay electrode R6C is in contact with semiconductor layer SC2C via a contact hole CH11C. In addition, the relay electrode R6C is in contact with a relay electrode disposed in the layer above the relay electrode R6C, via a contact hole CH22. The contact hole CH22 is a through hole penetrating the insulating layer 14, and brings the relay electrode R6C into contact with a relay electrode R8C to be described later. The relay electrode R6C does not overlap with a channel area of the semiconductor layer SC2C in planar view, the channel area being formed at a position where semiconductor layer SC2C is opposed to the branch portions of the second scanning line SGL2.

A second light-shielding layer LS21 is disposed in the opening of the sub-pixel SP3, at a position overlapping with a part of the semiconductor layer SC2A, a part of the branch portion of the first scanning line SGL1, and a part of the island-like shaped relay electrode R6A (hereinafter, notated to as a first position) in planar view. The second light-shielding layer LS21 not only is disposed at the first position described above, but also extends, in the opening of the sub-pixel SP3, to a position overlapping with a part of the semiconductor layer SC2C, a part of a branch portion of the second scanning line SGL2, and a part of the island-like shaped relay electrode R7C (hereinafter, notated to as a second position) in planar view.

The second light-shielding layer LS21 blocks the light on at least a half of the channel area formed on the semiconductor layer SC2A at a position opposed to the branch portion of the first scanning line SGL1 that is located in the opening of the sub-pixel SP3, the half being on the side of the island-like shaped relay electrode R6A (that is, the half of the channel area on the side of the drain electrode of the switching element SW2A). In addition, the second light-shielding layer LS21 also blocks the light on at least a half of the channel area formed on the semiconductor layer SC2C at a position opposed to the branch portion of the second scanning line SGL2 that is located in the opening of the sub-pixel SP3, the half being the half on the side of the island-like shaped relay electrode R7C (that is, the half of the channel area on the side of the source electrode of the switching element SW2C).

Incidentally, in the example explained in the present embodiment, one second light-shielding layer LS21 is disposed across the first position and the second position, but the present invention is not limited thereto. A light-shielding layer corresponding to the first position and a light-shielding layer corresponding to the second position may be provided separately with a predetermined space therebetween.

A second light-shielding layer LS22 is disposed in the opening of the sub-pixel SP1 at a position overlapping with a part of the semiconductor layer SC2A, a part of the branch portion of the first scanning line SGL1, and a part of the island-like shaped relay electrode R7A (hereinafter, notated to as a third position) in planar view. The second light-shielding layer LS22 is not only disposed to at the third position described above, but also extends, in an opening of the sub-pixel SP1, to a position overlapping with a part of the semiconductor layer SC2C, a part of a branch portion of the second scanning line SGL2, and a part of the island-like shaped relay electrode R6C (hereinafter, notated to as a fourth position) in planar view.

The second light-shielding layer LS22 blocks the light on at least a half of the channel area formed on the semiconductor layer SC2A at a position opposed to the branch portion of the first scanning line SGL1 that is located in the opening of the sub-pixel SP1, the half being on the side of the island-like shaped relay electrode R7A (that is, the half of the channel area on the side of the source electrode of the switching element SW2A). In addition, the second light-shielding layer LS22 also blocks the light on at least a half of the channel area formed on the semiconductor layer SC2C at a position opposed to the branch portion of the second scanning line SGL2 that is located in the opening of the sub-pixel SP1, the half being the half on the side of the island-like shaped relay electrode R6C (that is, the half of the channel area on the side of the drain electrode of the switching element SW2C).

Incidentally, in the example explained in the present embodiment, one second light-shielding layer LS22 is disposed across the third position and the fourth position, but a light-shielding layer corresponding to the third position and a light-shielding layer corresponding to the fourth position may be provided separately with a predetermined space therebetween, in the same manner as the second light-shielding layer LS21 described above.

As described above, in the present embodiment, because the second light-shielding layers LS21 and LS22 block the light on the switching element SW2A, and prevent the light from the illumination device BL from becoming incident, it is possible to suppress optical leakage that may occur due to the light from the illumination device BL becoming incident. More specifically, it is possible to suppress optical leakage from the source electrode to the drain electrode of the switching element SW2A, and therefore, to suppress degradation of the sensor characteristics of the sensor SS.

In the same manner, in the present embodiment, because the second light-shielding layers LS21 and LS22 block the light on the switching element SW2C, and prevent the light from the illumination device BL from becoming incident, it is possible to suppress optical leakage that may occur due to the light from the illumination device BL becoming incident. More specifically, it is possible to suppress optical leakage from the source electrode to the drain electrode of the switching element SW2C, and therefore, to suppress degradation of the sensor characteristics of the sensor SS.

Incidentally, in the example explained in the present embodiment, the second light-shielding layers LS21 and LS22 block the light on both of the source electrode sides and the drain electrode sides of the switching elements SW2A and SW2C. However, depending on the illuminance of the illumination device BL, it is also possible to block the light on only one of the source electrode and the drain electrode sides of the switching elements SW2A and SW2C, and not the light on the other. In such an example, because the blue sub-pixel SP3 affects the display quality less than the red sub-pixel SP1 and the green sub-pixel SP2, it is desirable to use a configuration in which only the second light-shielding layer LS21 disposed in the opening of the blue sub-pixel SP3 is provided, while the second light-shielding layer LS22 disposed in the opening of the red sub-pixel SP1 is omitted. With this, it is possible to suppress the optical leakage described above in the switching elements SW2A and SW2C, while preventing the reduction in the aperture ratio of the red sub-pixel SP1 due to the second light-shielding layer LS22 being disposed.

Incidentally, note that, as shown in FIG. 5, from the point of view of the yield, the parasitic capacitance, the aperture ratio of the sub-pixel SP2, and the transistor characteristics, it is desirable not to dispose a light-shielding layer for the switching element SW2B. However, it is not mandatory for a light-shielding layer not to be provided correspondingly to the switching element SW2B, and a light-shielding layer may be further provided corresponding to the switching element SW2B, as needed.

Incidentally, the switching element SW1 is interposed between the first scanning line SGL1 and the scanning line GL, as an element related displaying images. The semiconductor layer SC1 included in the switching element SW1 is in contact with the signal line SL of the corresponding color via the contact hole CH1. In addition, the semiconductor layer SC1 included in the switching element SW1 is in contact with the relay electrode R1 via the contact hole CH2. The relay electrode R1 is in contact with the relay electrode disposed in the layer above the relay electrode R1, via the contact hole CH3.

In addition, the first light-shielding layer LS1 is disposed at a position overlapping with a part of the semiconductor layer SC1, a part of the scanning line GL, and the island-like shaped relay electrode R1 in planar view. Incidentally, note that shown in FIG. 5 is a configuration in which the first light-shielding layer LS1 blocks the light on the half of one of the two channel areas formed in the semiconductor layer SC1, the channel areas opposed to the scanning line GL, and the half being the half on the side of the relay electrode R1, but the present invention is not limited thereto, and the first light-shielding layer LS1 may block both of such channel areas. Alternatively, the first light-shielding layer LS1 may block the light on only the other channel area. In other words, the first light-shielding layer LS1 may be configured to block at least one of the two channel areas formed in the semiconductor layer SC1.

In FIGS. 6 and 7, which will be described later, for the convenience of description, elements related to displaying images and interposed between the first scanning line SGL1 and the scanning line GL are no shown.

FIG. 6 is a plan view schematically showing elements that may be applied to the first substrate SUB1 and are interposed between insulating layers 15 and 16 shown in FIG. 4. In FIG. 6, the contact holes for making contact with the elements below the first power line SPL1, the second power line SPL2, and the sensor signal line SSL are indicated in broken lines, and the contact holes for making contact with the elements above the first power line SPL1, the second power line SPL2, and the sensor signal line SSL are indicated in solid lines. In addition, in FIG. 6, in order to facilitate understanding of the positional relationship, the scanning line GL, the signal line SL, the first scanning line SGL1, and the second scanning line SGL2 shown in FIG. 5 are also partially simplified. In addition, the relay electrodes R2 and R3 and the contact holes CH4 and CH5 related to the switching element SW1 are also omitted to facilitate understanding.

The first power line SPL1, the second power line SPL2, and the sensor signal line SSL extend in the second direction Y with some bent, and are arranged along the first direction X. The second power line SPL2 overlaps with the signal line SLG corresponding to the green sub-pixel SP2 in planar view. The first power line SPL1 overlaps with the signal line SLR corresponding to the red sub-pixel SP1 in planar view. The sensor signal line SSL overlaps with the signal line SLB corresponding to the blue sub-pixel SP3 in planar view.

The first electrode E1 of the sensor SS is disposed in the opening of the sub-pixel SP3. The first electrode E1 is in contact with the relay electrode R6A in the lower layer via the contact hole CH9. The photoelectric conversion element PC is disposed on the first electrode E1. The second electrode E2 of the sensor SS is disposed on the photoelectric conversion element PC. The sensor SS has an elliptical shape having a major axis extending in parallel with the second power line SPL2 and a minor axis orthogonal to the major axis. For this reason, the photoelectric conversion element PC, the first electrode E1, and the second electrode E2 are formed in an elliptical shape having a major axis extending in parallel with the second power line SPL2 and a minor axis orthogonal to the major axis. The second electrode E2 is in contact with the second power line SPL2 via the contact hole CH10.

As described above, the second power line SPL2 extends along the second direction Y in a manner overlapping with the signal line SLG corresponding to the sub-pixel SP2 in planar view. The second power line SPL2 has branch portion (convex portions) extending in the first direction X, and is in contact with the second electrode E2 of the sensor SS at the branch portion. As a result, the second power line SPL2 is electrically connected to the sensor SS, so that the second voltage VCOM can be supplied to the sensor SS.

Ab island-like shaped relay electrode R8B is disposed in the opening of the sub-pixel SP2. The relay electrode R8B is in contact with the relay electrode R7B in the lower layer via the contact hole CH13B. The relay electrode R8B is in contact with the relay electrode R9B that is disposed in a layer above the relay electrode R8B, via the contact hole CH14B. The relay electrode R9B is disposed in the opening of the sub-pixel SP2, overlaps with the relay electrode R8B in planar view, and is in contact with the relay electrode R8B in the lower layer, via the contact hole CH14B. In addition, the relay electrode R9B is in contact with the third power line SPL3 disposed in the layer above the relay electrode R9B, via the contact hole CH15B.

The island-like shaped relay electrode R8A is disposed in the opening of the sub-pixel SP1. The relay electrode R8A is in contact with the relay electrode R7A in the lower layer, via the contact hole CH13A. The relay electrode R8A is in contact with the first power line SPL1 disposed in the layer above the relay electrode R8A, via the contact hole CH14A. As described above, the first power line SPL1 extends along the second direction Y in a manner overlapping with the signal line SLR corresponding to the sub-pixel SP1 in planar view. The first power line SPL1 has branch portion (convex portions) extending along the first direction X, and is in contact with the relay electrode R8A at the branch portion. As a result, the first power line SPL1 is electrically connected to the switching element SW2A, and therefore, the first voltage VPP1 can be supplied to the switching element SW2A.

The island-like shaped relay electrode R8C is disposed in the opening of the sub-pixel SP1. The relay electrode R8C is in contact with the relay electrode R6C in the lower layer, via the contact hole CH22. The relay electrode R8C is in contact with the sensor signal line SSL disposed in the layer above the relay electrode R8C, via the contact hole CH14C. As described above, the sensor signal line SSL extends along the second direction Y in a manner overlapping with the signal line SLB corresponding to the sub-pixel SP3 in planar view. The sensor signal line SSL has branch portion (convex portions) extending along the first direction X, and is in contact with the relay electrode R8C at the branch portion.

FIG. 7 is a plan view schematically showing elements that may be applied to the first substrate SUB1 and are interposed between insulating layers 16 and 17 shown in FIG. 4. In addition, in FIG. 7, too, in order to facilitate understanding of the positional relationship, the scanning line GL, the signal line SL, the first scanning line SGL1, and the second scanning line SGL2 shown in FIG. 5 are also partially simplified. In addition, similarly to FIG. 6, the relay electrode R4 and contact hole CH5 connected to the switching element SW1 are not shown for the sake of clarity.

The third power line SPL3 extends in the second direction Y with some bent, in a manner overlapping with the signal line SLG and the second power line SPL2 corresponding to the green sub-pixel SP2 in planar view. The third power line SPL3 has an elliptical first branch portion SPL3A overlapping with the outer periphery of the photoelectric conversion element PC, in the opening of the sub-pixel SP3. In other words, the size of the first branch portion SPL3A is larger than the size of the photoelectric conversion element PC. The elliptical first branch portion SPL3A corresponds to the collimating layer CL1. The elliptical collimating layer CL1 has a circular opening OP. The elliptical collimate layer CL1 (first branch portion SPL3A) transmits light from the liquid crystal layer LC through the opening OP, and blocks the light from the liquid crystal layer LC in the other part.

In addition to the elliptical collimating layer CL1, the third power line SPL3 includes a second branch portion SPL3B (convex portion) extending along the first direction X, in the opening of the sub-pixel SP2. In this second branch portion SPL3B, the third power line SPL3 is in contact with the relay electrode R9B that is disposed in the opening of the sub-pixel SP2, via the contact hole CH15B. As a result, the third power line SPL3 is electrically connected to the switching element SW2B, and therefore, the third voltage VPP2 can be supplied to the switching element SW2B.

Incidentally, note that a part of the third power line SPL3 extending along the second direction Y while bending in a manner overlapping with the signal line SLG and the second power line SPL2 in planar view may also be referred to as a body portion, on contrary to the first branch portion SPL3A and the second branch portion SPL3B being referred to as branch portions.

Incidentally, a touch detection line TL1 is disposed at a position overlapping with the signal line SLB and the sensor signal line SSL in planar view. In addition, a touch detection line TL2 is disposed at a position overlapping with the signal line SLR and the first power line SPL1 in planar view. The touch detection lines TL1 and TL2 output a touch detection signal indicating which position in the display area DA the finger F has approached or is in contact with, to the controller CT. The touch detection line TL2 has a recess portion TL2A recessed to the side opposite to the opening of the sub-pixel SP2 at a position opposed to the second branch portion SPL3B that is branched from the third power line SPL3 into the opening of the sub-pixel SP2. In other words, the touch detection line TL2 has a shape recessed in a direction spaced apart from the second branch portion SPL3B at a position opposed to the second branch portion SPL3B. With this, it is possible to prevent the touch detection line TL2 and the second branch portion SPL3B from coming into contact with each other and short-circuiting.

According to the embodiment described above, because the display device DSP includes the second light-shielding layers LS21 and LS22, it is possible to prevent the light from the illumination device BL from becoming incident on the switching elements SW2A and SW2C, and to suppress optical leakage from the source electrodes to the drain electrodes of the switching elements SW2A and SW2C. With this, it is possible to suppress degradation of the sensor characteristics of the sensor SS due to the optical leakage described above. In addition, according to the present embodiment, the second light-shielding layer LS22 disposed in the opening of the red sub-pixel SP1 may be omitted depending on the illuminance of the illumination device BL, and the optical leakage described above may be suppressed without reducing the aperture ratio of the red sub-pixel SP1 that greatly affects the display quality.

Explained in the present embodiment described above is an example in which the switching elements SW1, SW2A, SW2B, and SW2C provided on the first substrate SUB1 have top-gate structures, but the present invention is not limited thereto, and the switching elements SW1, SW2A, SW2B, and SW2C provided on the first substrate SUB1 may also have bottom gate structures. An example in which the switching elements SW1, SW2A, SW2B, and SW2C provided on the first substrate SUB1 have bottom gate structures will now be explained as a modified example.

Figure 8:
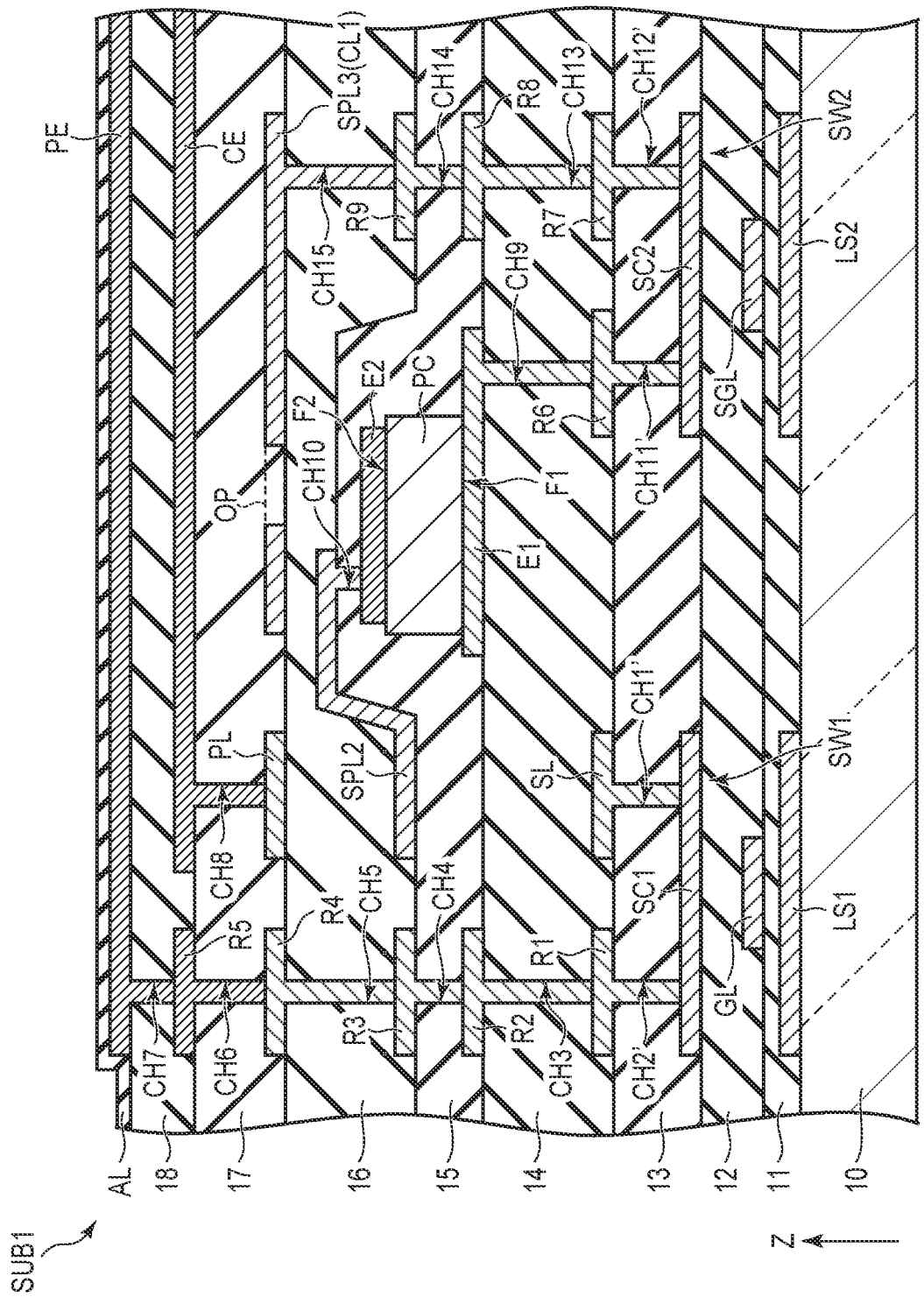
FIG. 8 is a schematic cross-sectional view showing an example of a structure that may be applied to a first substrate according to a modified example of the embodiment.

FIG. 8 is a cross-sectional view showing a cross-sectional structure of a first substrate SUB1 according to a modified example of the present embodiment. In the configuration according to the modified example, the scanning line GL is interposed between the insulating layers 11 and 12, and is opposed to the first light-shielding layer LS1 disposed between the first base 10 and the insulating layer 11. The semiconductor layer SC1 included in the switching element SW1 is interposed between insulating layers 12 and 13, and is opposed to scanning line GL. The signal line SL interposed between the insulating layers 13 and 14 is in contact with the semiconductor layer SC1 via a contact hole CH1' penetrating the insulating layer 13. In addition, the relay electrode R1 interposed between the insulating layers 13 and 14 is in contact with the semiconductor layer SC1 via a contact hole CH2' penetrating the insulating layer 13.

In addition, in the configuration according to the modified example, the sensor scanning line SGL is interposed between the insulating layers 11 and 12, and is opposed to the second light-shielding layer LS2 disposed between the first base 10 and the insulating layer 11. The semiconductor layer SC2 included in the switching element SW2 is interposed between the insulating layers 12 and 13, and is opposed to the sensor scanning line SGL. The relay electrode R6 interposed between the insulating layers 13 and 14 is in contact with the semiconductor layer SC2 via a contact hole CH11' penetrating the insulating layer 13. In addition, the relay electrode R7 interposed between the insulating layers 13 and 14 is in contact with the semiconductor layer SC2 via a contact hole CH12' penetrating the insulating layer 13.

Incidentally, note that, because the other configurations are the same as those in the top-gate structure shown in FIG. 4, detailed descriptions thereof will be omitted herein.

In FIG. 8, for the convenience of descriptions, elements associated with the plurality of switching elements SW2A, SW2B, and SW2C that are related to the sensor SS are represented as a switching element SW2. In addition, in FIG. 8, an element functioning as the gate electrode of the switching element SW2 is represented as a sensor scanning line SGL. In FIG. 8, an element functioning as the source electrode of the switching element SW2 is represented as the relay electrode R7. In FIG. 8, an element functioning as a drain electrode of the switching element SW2 is represented as the relay electrode R6. In addition, in FIG. 8, not all but some of the elements related to the sensor SS are shown. For example, it is possible to understand that the relay electrode R6 is connected to the drain of the switching element SW2A, and the relay electrode R7 is connected to the source of the switching element SW2B, in the same manner as in FIG. 4.

Figure 9:
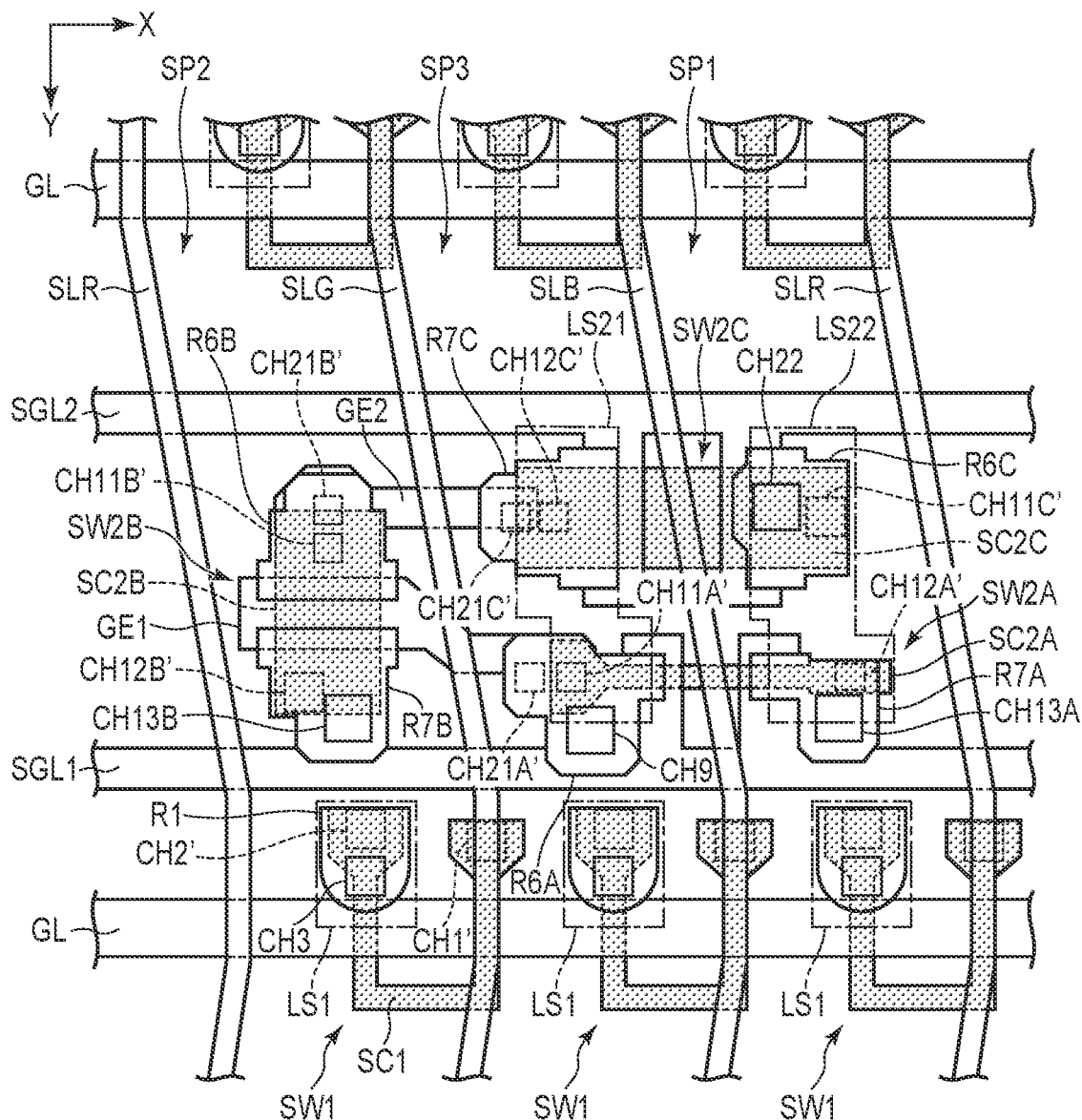
FIG. 9 is a schematic plan view showing the example of the structure that may be applied to the first substrate according to the modified example of the embodiment.

FIG. 9 is a plan view schematically showing elements that may be applied to first substrate SUB1 according to the modified example of the embodiment, and that are interposed between insulating layers 11, 12, 13, and 14 shown in FIG. 8. In FIG. 9, the contact holes for making contacts with the elements in the layers below the signal line SL and the relay electrodes R1, R6, and R7 are indicated by broken lines, and contact holes for making contact with the elements above the signal line SL and the relay electrodes R1, R6, and R7 are indicated by solid lines.

In addition, in FIG. 9, "A" is appended to the ends of the reference numerals of the elements that are related to the switching element SW2A. "B" is appended to the ends of the reference numerals of the elements that are related to the switching element SW2B, and "C" is appended to the ends of the reference numerals of the elements that are related to the switching element SW2C. Hereinafter, only elements that are different from those in the plan view of FIG. 5 will be explained, and explanations of the same elements will be omitted.

An island-like shaped relay electrode R7A functioning as a source electrode of the switching element SW2A is disposed at a position overlapping with the semiconductor layer SC2A included in the switching element SW2A, in the opening of the sub-pixel SP1. The relay electrode R7A is in contact with the semiconductor layer SC2A via the contact hole CH12A'. The relay electrode R7A overlaps with a part of the branch portion of first scanning line SGL1 in planar view. In other words, the relay electrode R7A overlaps with a half of a channel area that is formed on the semiconductor layer SC2A at a position opposed to the branch portion of the first scanning line SGL1 located in the opening of the sub-pixel SP1, the half being a half on the side of the relay electrode R7A in planar view. With this, the relay electrode R7A can block the light from the side of the liquid crystal layer LC, and prevent the light from becoming incident on the channel area.

An island-like shaped relay electrode R6A functioning as a drain electrode of the switching element SW2A is disposed at a position overlapping with the semiconductor layer SC2A included in the switching element SW2A in the opening of the sub-pixel SP3. The relay electrode R6A is in contact with the semiconductor layer SC2A via a contact hole CH11A'. The relay electrode R6A overlaps with a part of the branch portion of the first scanning line SGL1 in planar view. In other words, the relay electrode R6A overlaps with a half of a channel area that is formed on the semiconductor layer SC2A at a position opposed to the branch portion of the first scanning line SGL1 located in the opening of the sub-pixel SP3, the half being a half on the side of the relay electrode R6A in planar view. With this, the relay electrode R6A can block the light from the side of the liquid crystal layer LC, and prevent the light from becoming incident on the channel area. Incidentally, the relay electrode R6A is in contact with the first gate electrode GE1 functioning as a gate electrode of the switching element SW2B, via a contact hole CH21A' penetrating the insulating layers 12 and 13.

An island-like shaped relay electrode R7B functioning as a source electrode of the switching element SW2B is disposed at a position overlapping with the semiconductor layer SC2B. The relay electrode R7B is in contact with the semiconductor layer SC2B via a contact hole CH12B'. The relay electrode R7B overlaps a part of the first gate electrode GE1 in planar view. In other words, the relay electrode R7B overlaps with at least a part of the channel area formed on the semiconductor layer SC2B, the part the channel area being a part on the side of the source electrode in planar view. In addition, the island-like shaped relay electrode R6B functioning as a drain electrode of the switching element SW2B is disposed at a position overlapping with the semiconductor layer SC2B. The relay electrode R6B is in contact with the semiconductor layer SC2B via a contact hole CH11B'. The relay electrode R6B overlaps a part of the first gate electrode GE1 in planar view. In other words, the relay electrode R6B overlaps with at least a part of the channel area formed on the semiconductor layer SC2B, the part of the channel area being a part on the side of the drain electrode in planar view. With this, the relay electrode R7B and the relay electrode R6B can block the light from the liquid crystal layer LC side, and can prevent the light from becoming incident on the channel area. Incidentally, the relay electrode R6B is in contact with the second gate electrode GE2 via a contact hole CH21B' penetrating the insulating layers 12 and 13.

The island-like shaped relay electrode R7C functioning as a source electrode of the switching element SW2C is disposed at a position overlapping with the semiconductor layer SC2C included in the switching element SW2C, in the opening of the sub-pixel SP3. The relay electrode R7C is in contact with semiconductor layer SC2C via a contact hole CH12C'. The relay electrode R7C overlaps with a part of the branch portion of the second scanning line SGL2 in planar view. In other words, the relay electrode R7C overlaps with a half of a channel area that is formed on the semiconductor layer SC2C at a position opposed to the branch portion of the second scanning line SGL2 located in the opening of the sub-pixel SP3, the half being a half on the side of the relay electrode R7C in planar view. With this, the relay electrode R7C can block the light from the side of the liquid crystal layer LC, and prevent the light from becoming incident on the channel area. Incidentally, the relay electrode R6A is in contact with second gate electrode GE2 via a contact hole CH21C' penetrating the insulating layers 12 and 13.

The island-like shaped relay electrode R6C functioning as a drain electrode of the switching element SW2C is disposed at a position overlapping with the semiconductor layer SC2C included in the switching element SW2C, in the opening of the sub-pixel SP1. The relay electrode R6C is in contact with the semiconductor layer SC2C via the contact hole CH11C'. The relay electrode R6C overlaps with a part of the branch portion of the second scanning line SGL2 in planar view. In other words, the relay electrode R6C overlaps with a half of a channel area that is formed on the semiconductor layer SC2C at a position opposed to the branch portion of the second scanning line SGL2 located in the opening of the sub-pixel SP1, the half being a half on the side of the relay electrode R6C in planar view. With this, the relay electrode R6C can block the light from the liquid crystal layer LC side and prevent the light from becoming incident on the channel area.

Incidentally, note that, because the other configurations are the same as those in the top-gate structure shown in FIG. 5, detailed descriptions thereof will be omitted herein.

Because, in the configuration according to the present modified example described above, too, there is no difference in that the display device DSP includes the second light-shielding layers LS21 and LS22, it is possible to achieve the same advantageous effects described above.

According to the embodiment described above, it is possible to improve the detection accuracy of the sensor SS (optical sensor) included in the display device DSP (liquid crystal display device).

Incidentally, in the present specification, the display device DSP is explained to be a liquid crystal display device including the illumination device BL, but the embodiment is not limited thereto, and the display device DSP may be an organic electroluminescent display device including organic light-emitting diodes (OLEDs) as display elements.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a first substrate;
   a second substrate opposed to the first substrate;
   a liquid crystal layer located between the first substrate and the second substrate;
   an illumination device opposed to the first substrate and disposed on an opposite side of the second substrate, wherein
   the first substrate includes:
   a base;
   a sensor that is located between the base and the liquid crystal layer in a display area that includes pixels, and that outputs a detection signal corresponding to light becoming incident from a side of the liquid crystal layer;
   a sensor circuit that includes a switching element and that is connected to the sensor; and
   a sensor light-shielding layer that is opposed to a channel area formed in a semiconductor layer included in the switching element, and that blocks light from the illumination device on the channel area.

2. The display device of claim 1, wherein
   the sensor includes:
   a photoelectric conversion element having a first surface opposed to the base and a second surface opposed to the liquid crystal layer;
   a first electrode in contact with the first surface; and
   a second electrode in contact with the second surface,
   the sensor circuit includes:
   a first switching element configured to reset an electric potential of the first electrode;
   a second switching element configured to amplify the detection signal; and
   a third switching element configured to output the amplified detection signal, and
   the sensor light-shielding layer includes:
   a first sensor light-shielding layer opposed to a channel area that is formed in a semiconductor layer included in the first switching element; and
   a second sensor light-shielding layer opposed to a channel area that is formed in a semiconductor layer included in the third switching element.

3. The display device of claim 2, wherein the sensor light-shielding layer is not disposed at a position opposed to the channel area formed on the semiconductor layer included in the second switching element.

4. The display device of claim 2, wherein
   each of the pixels includes a first sub-pixel corresponding to red color, a second sub-pixel corresponding to green color, and a third sub-pixel corresponding to blue color, and
   the sensor is disposed in an area where the third sub-pixel is located.

5. The display device of claim 4, wherein both the first switching element and the third switching element are disposed in a manner straddling across an area where the first sub-pixel is located and an area where the third sub-pixel is located.

6. The display device of claim 5, wherein
   in the first switching element, a source electrode is disposed in the area where the first sub-pixel is located, and a drain electrode is disposed in the area where the third sub-pixel is located,
   in the third switching element, a source electrode is disposed in the area where the third sub-pixel is located, and a drain electrode is disposed in the area where the first sub-pixel is located, and
   the first sensor light-shielding layer blocks light on at least a part of the channel area formed on the semiconductor layer included in the first switching element, the part being a part on a side of the drain-electrode, and
   the second sensor light-shielding layer blocks light on at least a part of the channel area formed on the semiconductor layer included in the third switching element, the part being a part on a side of the source electrode.

7. The display device of claim 2, wherein the first substrate includes:
   a pixel circuit provided correspondingly to each of the pixels and including a fourth switching element; and
   a pixel light-shielding layer that is opposed to a channel area formed in a semiconductor layer included in the fourth switching element, and that blocks light from the illumination device on the channel area.

8. The display device of claim 7, wherein the pixel light-shielding layer blocks light on at least one of one part and another part of the channel area formed on the semiconductor layer included in the fourth switching element, the one part being on a side of a source electrode and the other part being on a side of a drain electrode of the fourth switching element, respectively.

9. The display device of claim 2, wherein
   the first electrode is formed of a metal material, and
   the second electrode is formed of a transparent conductive material.

* * * * *